United States Patent
Portell I De Mora et al.

(10) Patent No.: US 9,002,913 B2
(45) Date of Patent: Apr. 7, 2015

(54) METHOD FOR FULLY ADAPTIVE CALIBRATION OF A PREDICTION ERROR CODER

(75) Inventors: Jordi Portell I De Mora, Torello (ES); Enrique Garcíaberro Montilla, Barcelona (ES); Xavier Luri Carrascoso, Barcelona (ES); Alberto González Villafranca, Barcelona (ES); Jorge Torra Roca, Barcelona (ES)

(73) Assignees: Universidad de Barcelona, Barcelona (ES); Universitat Politecnica de Catalunya, Barcelona (ES)

( * ) Notice: Subject to any disclaimer, the term of this patent is extended or adjusted under 35 U.S.C. 154(b) by 569 days.

(21) Appl. No.: 13/380,385

(22) PCT Filed: Jun. 22, 2009

(86) PCT No.: PCT/ES2009/000336
§ 371 (c)(1),
(2), (4) Date: Mar. 20, 2012

(87) PCT Pub. No.: WO2010/149799
PCT Pub. Date: Dec. 29, 2010

(65) Prior Publication Data
US 2012/0166503 A1 Jun. 28, 2012

(51) Int. Cl.
H03M 7/40 (2006.01)
(52) U.S. Cl.
CPC .................... H03M 7/40 (2013.01)
(58) Field of Classification Search
CPC ...................... H03M 7/40; H03M 7/3059
USPC ........................................................ 708/203
See application file for complete search history.

(56) References Cited

U.S. PATENT DOCUMENTS

| 4,344,086 A | * | 8/1982 | Mizuno | 358/539 |
| 5,848,195 A | * | 12/1998 | Romriell | 382/246 |
| 5,884,269 A | | 3/1999 | Cellier et al. | |
| 5,944,774 A | * | 8/1999 | Dent | 708/517 |

(Continued)

FOREIGN PATENT DOCUMENTS

ES 2 143 759 5/2000

OTHER PUBLICATIONS

Consultative Committee for Space Data Systems. "Lossless Data Compression. Blue Book CCSDS 121.0-B-1." 1997. http://public.ccsds.org/publications/archive/121x0b1c2.pdf.

(Continued)

*Primary Examiner* — Chat Do
*Assistant Examiner* — Calvin M Brien
(74) *Attorney, Agent, or Firm* — Merchant & Gould P.C.

(57) ABSTRACT

Method for fully adaptive calibration of a prediction error coder, comprising a first step of initialization; a second step of reception and accumulation of block-size data samples wherein for each received value, it is added one to the histogram bin associated to that value; a third step of analysis of the histogram and determination of the coding option; a fourth step of analysis of the histogram and determination of a coding table; a fifth step of output a header with the prediction error coder coding table determined; and wherein previous steps are repeated if more samples need to be compressed. It is useful as a data compression technique, with the advantage of being faster and more robust than the current CCSDS lossless compression standard.

7 Claims, 11 Drawing Sheets

(56) References Cited

U.S. PATENT DOCUMENTS

| | | | |
|---|---|---|---|
| 5,959,675 A * | 9/1999 | Mita et al. | 375/240.04 |
| 2004/0037461 A1 * | 2/2004 | Lainema | 382/166 |
| 2007/0200737 A1 | 8/2007 | Gao et al. | |
| 2008/0260270 A1 * | 10/2008 | Lainema | 382/238 |
| 2010/0040153 A1 * | 2/2010 | Imanaka et al. | 375/240.27 |
| 2010/0303354 A1 * | 12/2010 | Reznik | 382/168 |

OTHER PUBLICATIONS

Portell et al. "Designing optimum solutions for lossless data compression in space." *Proceedings of the On-Board Payload Data Compression Workshop ESA*, Jun. 2008. 8 pages.

International Search Report for International Application No. PCT/ES2009/000336 mailed Mar. 3, 2010.

* cited by examiner

METHOD FOR FULLY ADAPTIVE CALIBRATION OF A PREDICTION ERROR CODER

This application is a National Stage Application of PCT/ES2009/000336, filed 22 Jun. 2009, and which application is incorporated herein by reference. To the extent appropriate, a claim of priority is made to the above disclosed application.

The present invention relates to the processing of digital information and more specifically, to optimized data compression techniques. The present invention is particularly, though not exclusively, applicable in the field of satellite communication on-board systems.

BACKGROUND ART

The current space mission concept comprises a large set of different strategies, instruments and scientific objectives. As the accuracy of the instruments increases, more telemetry resources are required to download the huge amounts of data generated. Considering the very important constraints of telemetry bandwidth in space, a direct consequence is the need of compressing the data before being transmitted. Having in mind the large diversity of data, a universal coder offering the highest possible compression ratios for almost any kind of data benefits the vast majority of space missions.

As an answer to this challenge, the CCSDS (Consultative Committee for Space Data Systems) proposed a universal compression solution based on a two-stage strategy. The pre-processor stage changes the statistics of the data by applying a reversible function, while the coder stage outputs a variable number of bits for each symbol to be coded. This method accomplishes the objectives mentioned above. It is a quick algorithm that yields good compression ratios and, what is most important, it fully adapts to the data being compressed. Additionally, the system works with data blocks of just 8 or 16 samples, thus rapidly adapting to changes in the data.

This two-stage strategy is an otherwise typical approach also used by several data compression systems. One of the reasons is the availability of many coding algorithms, such as Huffman, arithmetic, range encoding or Rice-Golomb. The latter is the algorithm used in the CCSDS recommendation due to its simplicity and low processing requirements. In most cases, the best compression ratios cannot be obtained with only such coding stage due to the large variety of data commented before. On the other hand, the introduction of a relatively simple pre-processing stage can usually boost the final ratios obtained by the system. Additionally, such pre-processing stage can be adapted to the appropriated needs if necessary, while the coding stage can be kept unchanged.

The pre-processor basically reduces the data entropy, easing the task of the coding stage, since it is most frequently designed in the form of an entropy coder as in the CCSDS recommendation. The pre-processing is often based on a data predictor followed by a differentiator, thus outputting prediction errors. In some cases, such as in the CCSDS standard, it is followed by a value mapper which consists on transforming the positive and negative values to just positive ones through a reversible algorithm. Theoretically, this method helps improving the compression ratio, since the sign bit is not necessary. On the other hand, if signed values are directly coded with a separate sign bit, there will be two codes representing the zero ("+0" and "−0").

If the prediction is correctly done in the first stage, the error will be small and hence fewer bits will be required to code it. Most of the input data sets can lead to prediction errors that roughly follow a Laplacian distribution. The adaptive entropy coder recommended by the CCSDS is optimal for this distribution, but any deviation from this can lead to a significant decrease in the final compression ratio. To mitigate this weakness in the CCSDS recommendation inventors have developed the so-called PEC (Prediction Error Coder; cf. J. Portell et al., "Designing optimum solutions for lossless data compression in space", Proceedings of the On-Board Payload Data Compression Workshop ESA, June 2008). It is a partially adaptive solution that needs to be tuned according to the expected distribution of the prediction errors to be compressed. The tests performed revealed that, under realistic conditions, PEC outperforms the Rice coder if adequately calibrated. An automatic PEC calibrator has also been developed, making possible in-orbit re-calibrations of the coder if necessary. This is a mandatory feature, despite of the robustness of PEC. Even the most realistic instrument simulator cannot provide the data that will actually be observed by a satellite, and hence an on-ground calibrated PEC will offer non-optimal compression ratios. An adaptive version of the coder is desirable in order to guarantee the best ratios under any situation.

Data pre-processing is mandatory in any data compression system in order to get the best possible results. It makes possible to achieve the highest compression ratios with the lowest processing requirements. There are many strategies depending on the types of data received, and it is not possible to give a universal method. However, it is important to point out that the objective of the pre-processing stage is to eliminate the correlation between samples and, in general, to decrease the entropy of the input data. Thus, the data are rearranged to some optimal statistics, usually following a distribution that resembles a Laplacian one. After this stage it is then possible to apply a universal coder.

The CCSDS recommendation introduces the PEM (Prediction Error Mapper) immediately after the pre-processing stage. It maps the signed prediction errors into the initial (unsigned) data range, thus avoiding the problem of coding signed values, and thus saving the sign bit.

Nevertheless, in software implementations it implies a non-negligible computational cost. Additionally, it avoids the possibility of generating a "−0" (minus zero) code, which is required by this new coding algorithm. For these reasons it has been chosen to get rid of this mapping stage in the coding algorithm used in the present invention.

The CCSDS recommendation for lossless data compression in space missions includes the split sample mode—the Rice coder—as the general-purpose compression technique. It is worth mentioning that the Rice code is a specific Golomb code in which the factors applied are powers of 2. This variation is very interesting because the code can be computed with very few logical operations, thus making it very efficient on combinational logic circuits. Due to its simplicity and potential, it is a very interesting option for space missions. The adaptive algorithm of the CCSDS standard can also select other techniques, although in most cases the Rice coder will be chosen. The rest of the options are only useful in extreme cases, that is, with very good or very bad statistics.

Several studies have shown that the CCSDS standard is highly sensitive to the presence of noise and, especially, outliers, i.e. values completely outside of the expected statistics. It is an expected result considering that the Rice coder was devised for noiseless data. The excellent performance achieved with pure Laplacian data distributions rapidly degrades with noise, and also when receiving non-Laplacian statistics. This is due to the operation of the Rice-Golomb algorithm, which completely depends on the correct choice of its calibration parameter k. It must be chosen very carefully, because values of k which are too large will lead to low compression ratios, since a larger number of bits of the original value will be output. But the important risk appears when choosing values of k which are too small, which implies a huge number of bits in the fundamental sequence codeword. Hence, even low noise levels lead to a significant decrease in the compression ratio achievable with the CCSDS method.

On the other hand, the PEC system is specifically designed for the coding of prediction errors. That is, it implements the second stage (coding) of a data processing system, receiving the results of a first stage (pre-processing). The simplicity of PEC relies on the coding of value ranges as its basic strategy, the application of which requires only very few and simple calculations. It is actually similar to a coding tree, but with very short branches because these only represent the prefixes, not the values themselves. It is worth emphasizing that PEC is a signed coding algorithm, that is, it assumes the inclusion of a sign bit in the values to be coded. It can be applied to unsigned values as well, but its compression performance will not be optimal. The PEC coder includes two coding strategies. The first one is the Double-Smoothed (DS) algorithm, which is a ranged variable-length code (VLC). The second, or Large Coding (LC) algorithm, is based on prefix codes. In fact, the prefixes are unary codes with the addition of one sign bit at the end. Finally, the third one is the Low Entropy (LE) algorithm, a modification of DS that optimizes the results for highly compressible data.

PEC relies on the adequate definition of a coding table and a coding option. The coding table defines the number of coding ranges or segments. The size of each range (the bits used to code each range) will affect the size of the variable-length code generated. The coding option defines how such ranges are used, that is, how the variable-length code is formed from each value and the table definition.

1) Double-Smoothed option: The double-smoothed variant has been defined using four coding ranges, that is, with a coding table of four components. A five-range scheme was also tested but it was finally discarded because the compression gain was small. This algorithm is called double-smoothed because it has two shortcuts to reach the two last coding ranges. They are indicated with an escape value based on the "–0" code. The usage of coding segments combined with this escape value significantly smoothes the code lengths generated by large values, while keeping short codes for low values.

2) Large coding option: The operation of the large coding algorithm is similar. A coding table of four segments is still used, but now it is introduced a small header in the output code that directly indicates the code segment being used. This header, consisting of the unary code sequence, avoids the generation of "leap segments" and, thus, large values lead to shorter codes. The counterpart is a very small increase in the code size for the smallest values. Also, the "–0" code is not required in this variant, and hence the sign bit for zero is not included. This code is usually more efficient than the double-smoothed in the case of large values of the entropy. For this reason it will be mainly used for data fields in which the pre-processing results are significantly spread.

3) Low Entropy option: In cases where the expected entropy of the data to be compressed is very low, a modification of the double-smoothed option is applied. More specifically, the escape sequences for the second and third segments are exchanged. That is, the second segment is indicated by a "–0" code in the first segment, while the third segment is indicated by a leap value in the second segment. In this way, the full range of the first segment can be used (without reserving any leap value), which has a beneficial effect on the codification of very small values, at the expense of an increase in the code length for intermediate and large values.

It is worth mentioning here that the choice between the two coding variants is also taken automatically by the PEC calibrator described below. With the adequate combination of these two coding algorithms, high compression ratios can be achieved with a simple (thus fast) coding algorithm.

Hence, for the appropriated operation of the PEC coder, the system must be calibrated, i.e. an adequate coding table and coding option must be selected for the operation of PEC (this is one of the main disadvantages of the PEC coder which it is solved by the present invention). In order to easily determine the best configuration for each case an automated PEC calibrator is available. First of all, a representative histogram of the values to be coded shall be prepared. This histogram is equivalent to the probability density function (PDF) of the data field to compress, from which the entropy can be calculated. The histogram is passed through the PEC calibrator software, which runs an exhaustive analysis of the data and determines the best coding table and coding option. The optimal solution is obtained by means of a trial-and-error process, i.e. testing all the possible combinations and calculating the expected compression ratio for each. After this training stage, PEC is ready to operate on the real data. Although this calibration process is much quicker than it may seem, it is too expensive in computational terms for being included in the coder. In the case of space missions, the calibrator must be run on-ground with simulated data before launch. It should be run periodically during the mission as well, re-calibrating PEC with the data actually being compressed.

Owing to its coding strategy, PEC can be considered as a partially adaptive algorithm. That is, the adequate segment (and hence the code size) is selected for each one of the values. This is an advantage with respect to the Rice coder, which uses a fixed parameter for all the values, at least within a coding block, in the case of the CCSDS recommendation. Another advantage is that PEC limits the maximum code length to twice the symbol size in the worst of the cases (depending to the coding table). Nevertheless, despite of these features, should be noted that PEC must be trained for each case in order to get the best compression ratios. Therefore, if the statistics of the real data significantly differ from those of the training data, the compression ratio will decrease.

Summarizing, on one side the CCSDS system is too sensitive to any deviation of the input data and the software versions of said systems are too slow in most of the cases. On the other side, the PEC system is quite robust to deviations of the input data and the software versions are faster and more efficient than the CCSDS ones. However, the PEC system needs a previous calibration phase quite slow in computational terms.

SUMMARY OF THE INVENTION

In the present invention it is proposed a fully adaptive calibration method for PEC (i.e. without the necessity of a pre-calibration phase that the PEC technique has), which is at the same time quick and precise enough for becoming a data compression technique faster and more robust than the current CCSDS lossless compression standard.

The object of the present invention relates to a data compression technique which is an adaptive, auto calibrated coder which solves the weak points previously commented. In the present invention it is named Fully-Adaptive Prediction Error Coder (FAPEC), and it selects the best coding tables and coding option for a given data block. The length of a block is completely configurable and not necessarily restricted to a power of 2.

The method for fully adaptive calibration of a prediction error coder comprises:

a first step of initialization, comprising, a first initialization of a histogram of values, allocating the necessary resources, if it is not already available, and setting all bins to zero and mapping each histogram bin to a given value or range of values to be compressed;

a second initialization of a block size to a given value; and an allocation of the necessary resources for using a prediction error coder;

a second step of reception and accumulation of block-size data samples wherein for each received value, it is added one to the histogram bin associated to that value, storing the received value in a buffer and checking the amount of accumulated values has reached the block size value;

a third step of analysis of the histogram and determination of the coding option comprising, checking if the histogram accumulates a given probability in a given amount of bins, with such bins corresponding to the lowest values, if so a low entropy coding option is selected;

if the low entropy conditions are not fulfilled a new set of accumulated probability conditions are checked for a new given amount of bins wherein if said new conditions are fulfilled, a double-smoothed coding option is selected; and finally, if the double-smoothed conditions are not fulfilled neither, the large coding option is selected;

a fourth step of analysis of the histogram and determination of a coding table, selecting the configuration for each of the prediction error coder coding segment that fulfills a given condition depending on the selected coding option of the third step, for the relation between the accumulated probability of each range of values and the required bits to code such range;

a fifth step of output a header with the prediction error coder coding table determined; and wherein for each value stored in the buffer, said value is coded with a prediction error coder using the determined coding option and the determined coding table, outputting the resulting code; and wherein previous steps are repeated if more samples need to be compressed.

Auto-calibration: FAPEC accumulates the values to be compressed in blocks of a user-configured size. During this, an internal histogram of the module of the values is calculated on-the-fly. Once the required number of values has been accumulated, the algorithm analyzes the histogram to get the best coding parameters from it. More specifically, the accumulated probability for each value is calculated, starting from zero onwards. The choice of the coding option is defined through a set of accumulated probability thresholds (double-smoothed or large coding), as well as the coding table. That is, FAPEC defines the coding segments (and hence the coding table) according to their accumulated probability and code length. The definition of these probability thresholds can be seen as a fine tuning of FAPEC. In a non-limitative example the values are fixed with the help of the exhaustive PEC calibrator applied to synthetic data following Laplacian distributions. This nominal tuning will offer excellent compression ratios for almost any case. Nevertheless, it is clear that FAPEC can adapt even better to other statistics (such as Gaussian distributions) by just adjusting such thresholds. This is another significant advantage with respect to the current CCSDS standard, which is only prepared for Laplacian distributions.

Analyzing a histogram of values with large symbol sizes (such as 16 or 24 bits) can be very time consuming, and will actually lead to prohibitive processing times if naïvely (or exhaustively) implemented. For this reason FAPEC uses a logarithmic-like histogram, with increasing bin sizes for larger values. That is, large values are grouped and mapped to a single histogram bin, while full resolution is kept for the lowest values. This analysis is precise enough for the case of ranged entropy coding, which does not require a precise knowledge of the largest values. Once the coding parameters have been determined, they are explicitly output as a small header at the beginning of the compressed data block. This is another clear advantage of FAPEC. That is, the decoder only has to invert the PEC process with the parameters indicated by the header, without requiring any knowledge on the adaptive algorithm used by the coder. In this way, the fine-tuning thresholds of FAPEC or even the auto-calibration algorithm can be safely changed without requiring any modification in the decoding stage.

Block size: The data link in space missions, as any digital communications channel, is subject to noise and transmission errors. The problem in space communications is that a re-transmission of a data block received with unrecoverable errors is not always possible, especially for long distances. It forces the requirement of using small data blocks in the data compression stage. That is, adaptive algorithms requiring large amounts of data for their optimal operation, such as Huffman or LZW, are not applicable in space missions. The reason is that such algorithms use to include the decoding rules intrinsically in the compressed message, and hence it must be perfectly restored. Otherwise, all the data from the transmission error until the end of the block will be lost. In short, data compression systems used in space missions must use small and independent data blocks in order to guarantee the minimum possible losses in case of transmission errors.

Several tests have been done in order to analyze the effect of the block size on the compression ratio and on the processing requirements of FAPEC. The results reveal that larger block sizes usually lead to larger compression ratios, since the header output by FAPEC (about 16 bits per block) will represent a smaller relative overhead. Also, in synthetic data, larger blocks make possible a better statistics determination and, hence, a better adjusted coding table. This result may change when compressing real data, depending on their statistics and their changing rate. Another expected result is that the processing requirements decrease as the block size increases, since the histogram analysis is the FAPEC portion requiring more processing. It can be considered as an almost uniform processing overhead that, as the header, will represent a smaller fraction with larger block sizes.

Taking these results into account it is clear that the best solution is a block size as large as possible. Nevertheless, larger block sizes will present the problem mentioned above regarding transmission errors. Also, they will imply a worse adaptation to rapid changes in the data being compressed. Thus, in practice, it leads to lower compression ratios. Therefore, a compromise value must be chosen. The tests on synthetic data indicate that the block size should be between 256 and 1024 samples. The compression difference between these two cases is about 3%, while sizes larger than 1024 samples do not increase significantly the compression ratio. Regarding the processing requirements, using a block size of 256 samples is about 10% faster than with a block size of 128. Using blocks of 512, 1024 and 2048 samples leads to very small decreases in the processing requirements. In short, FAPEC should be used with data blocks of about 250 samples or more, and preferably with blocks of about 500 samples.

These are adequate block sizes for space communications. The preferred choice is 512 samples, which represents 1 KB when using 16-bit samples. Anyway, FAPEC does not require block sizes being powers of 2, so it is possible to adapt the block length to the features of the data to be compressed.

In a second aspect of the present invention, it is provided a fully adaptive prediction error coder device comprising:
  means of initialization, comprising,
    first means configured for the initialization of a histogram of values, allocating the necessary resources, if it is not already available, and setting all bins to zero and mapping each histogram bin to a given value or range of values to be compressed;
    second means configured for the initialization of a block size to a given value; and
    third means configured for the allocation of the necessary resources for using a prediction error coder;
  means configured for the reception and accumulation of block-size data samples wherein for each received value, it is added one to the histogram bin associated to that value, storing the received value in a buffer and checking the amount of accumulated values has reached the block size value;
  means configured for the analysis of the histogram and determination of a coding option selected from
    low entropy coding option;
    double-smoothed coding option; and
    large coding option;
  means configured for the analysis of the histogram and determination of a coding table, selecting the configuration for each of the prediction error coder coding segment that fulfills a given condition depending on the selected coding option of the third step, for the relation between the accumulated probability of each range of values and the required bits to code such range; and
  means for creating a header with the prediction error coder coding table determined; and wherein for each value stored in the buffer, said value is coded with a prediction error coder using the determined coding option and the determined coding table, outputting the resulting code.

Throughout the description and claims the word "comprise" and variations of the word, are not intended to exclude other technical features, additives, components, or steps. Additional objects, advantages and features of the invention will become apparent to those skilled in the art upon examination of the description or may be learned by practice of the invention. The following examples and drawings are provided by way of illustration, and they are not intended to be limiting of the present invention. Furthermore, the present invention covers all possible combinations of particular and preferred embodiments described herein.

BRIEF DESCRIPTION OF THE DRAWINGS

FIGS. 2a, 2c and 2e show the absolute compression ratios of the coders.
FIGS. 2b, 2d and 2f show the relative efficiency with respect to the Shannon limit.

FIGS. 4a, 4c and 4e show the absolute compression ratios of the coders. FIGS. 4b, 4d and 4f: relative efficiency with respect to the Shannon limit.

DETAILED DESCRIPTION OF PARTICULAR EMBODIMENTS

Figure 1A:
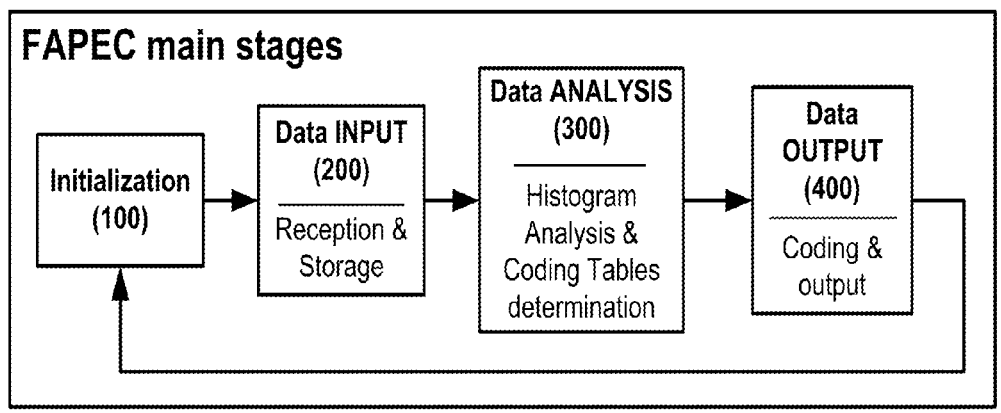
FIG. 1a shows a block diagram of FAPEC, object of the present invention.
Figure 1B:
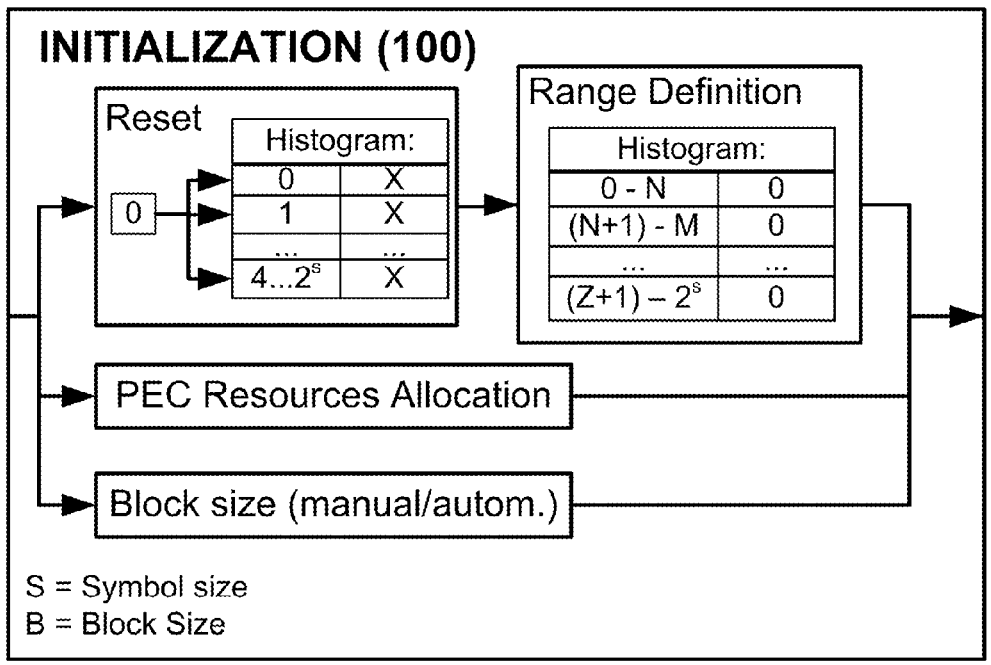
FIG. 1b shows a block diagram of the initialization part of FAPEC.
Figure 1C:
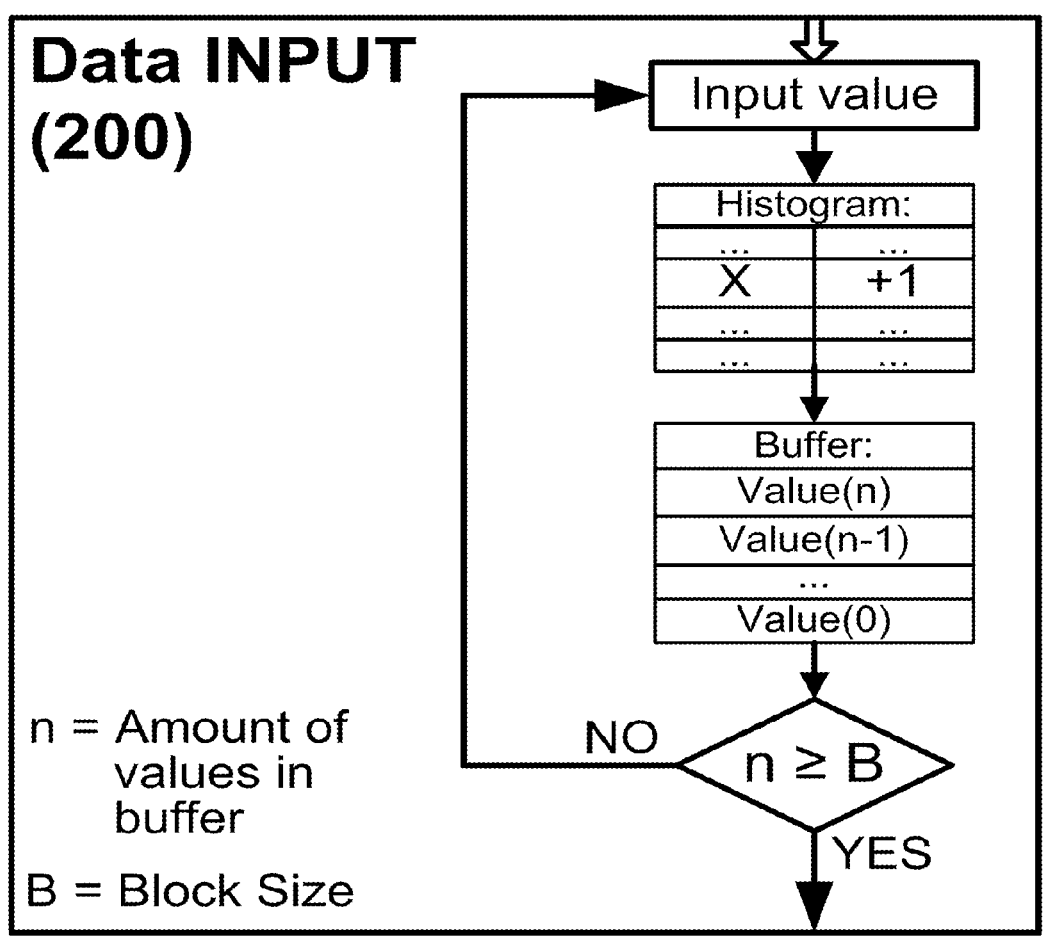
FIG. 1c shows a block diagram of the data input part of FAPEC.
Figure 1D:
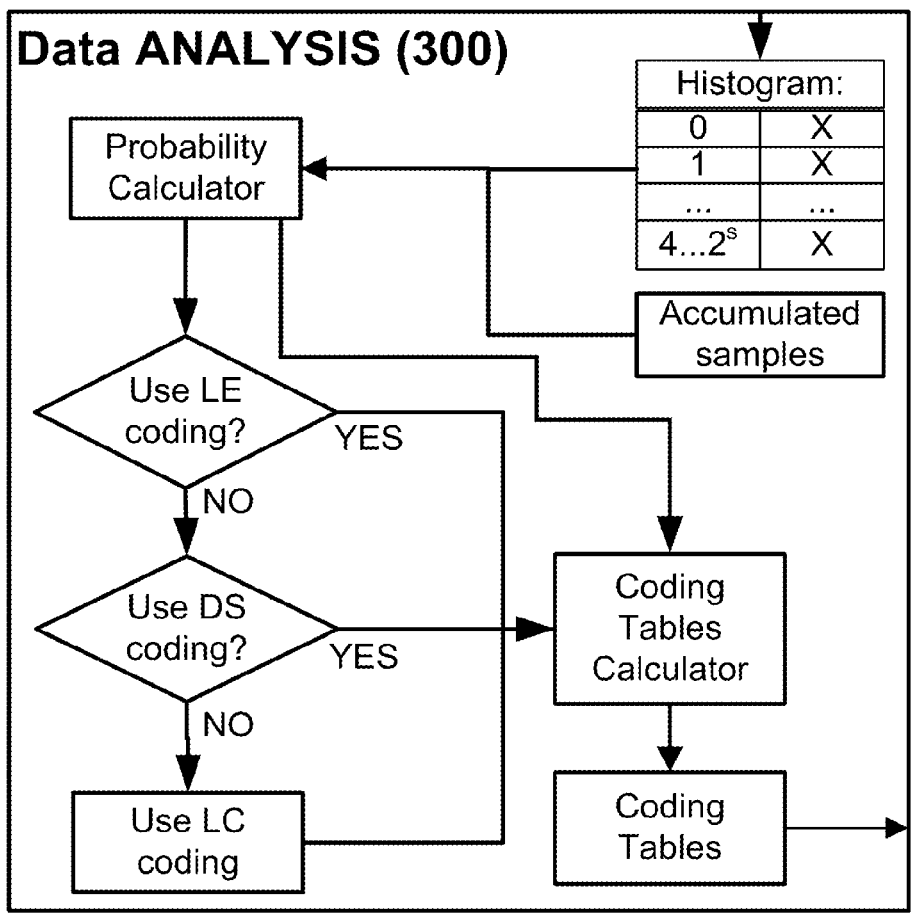
FIG. 1d shows a block diagram of the data analysis part of FAPEC.
Figure 1E:
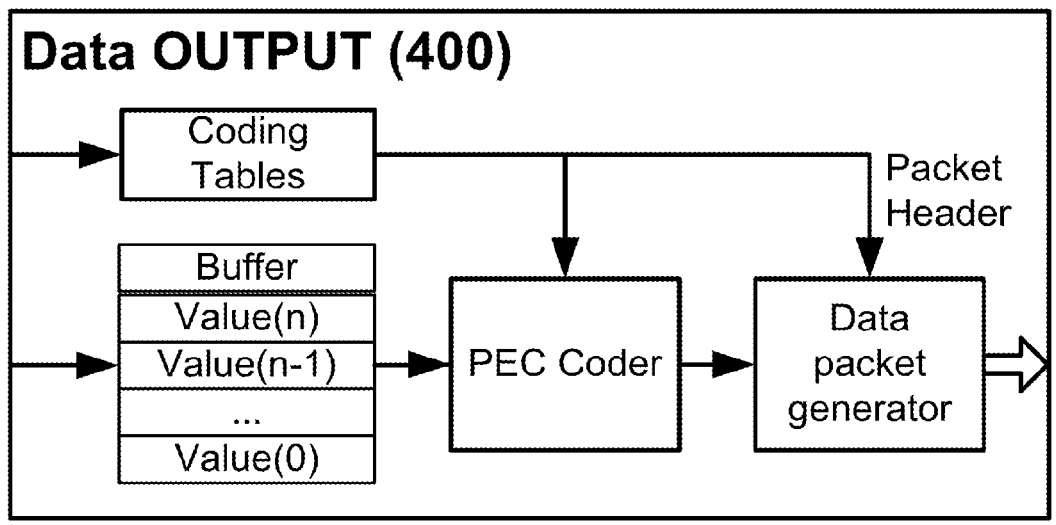
FIG. 1e shows a block diagram of the data output part of FAPEC.
Figure 2A:
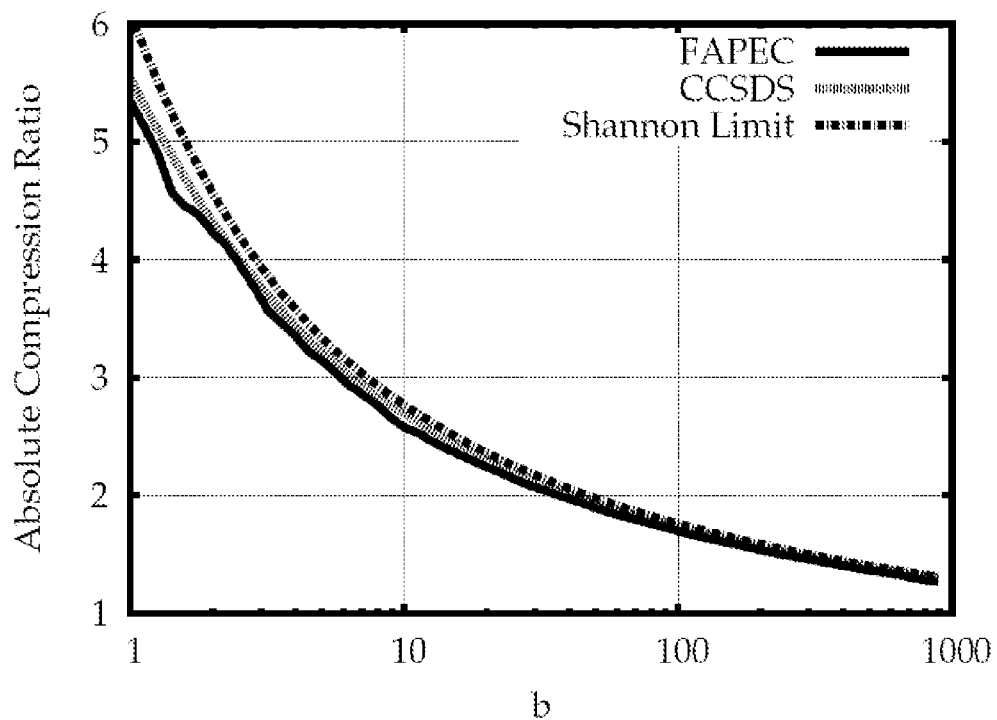
FIGS. 2a-2f show the compression ratios obtained for Laplacian distributions for tests with 0.1% (2a and 2b), 1% (2c and 2d) and 10% (2e and 2f) of additional flat noise.
Figure 2B:
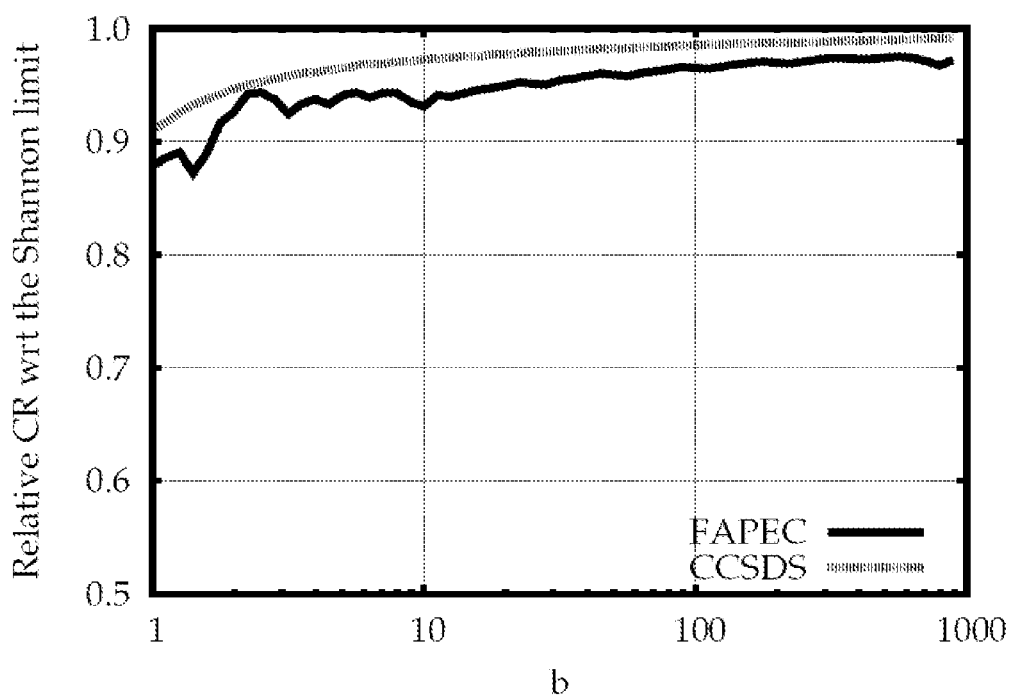
Figure 2C:
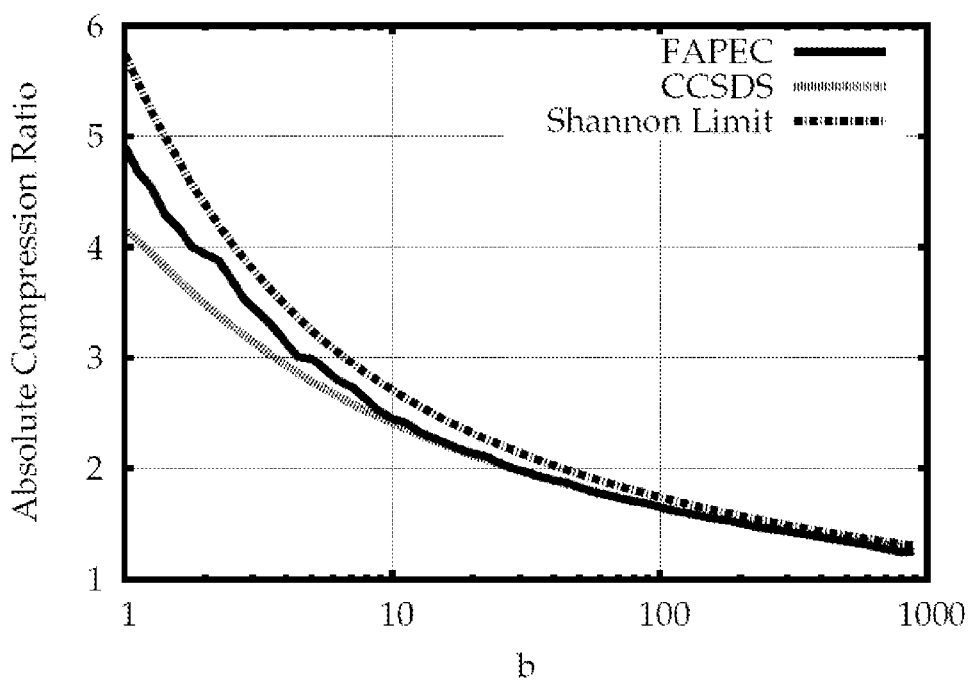
Figure 2D:
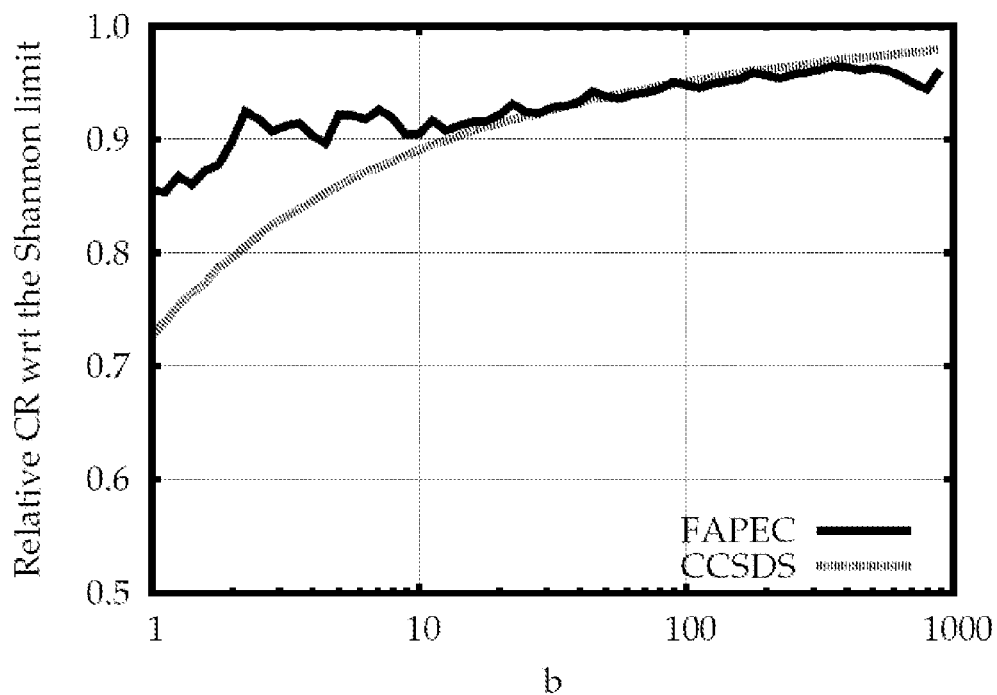
Figure 2E:
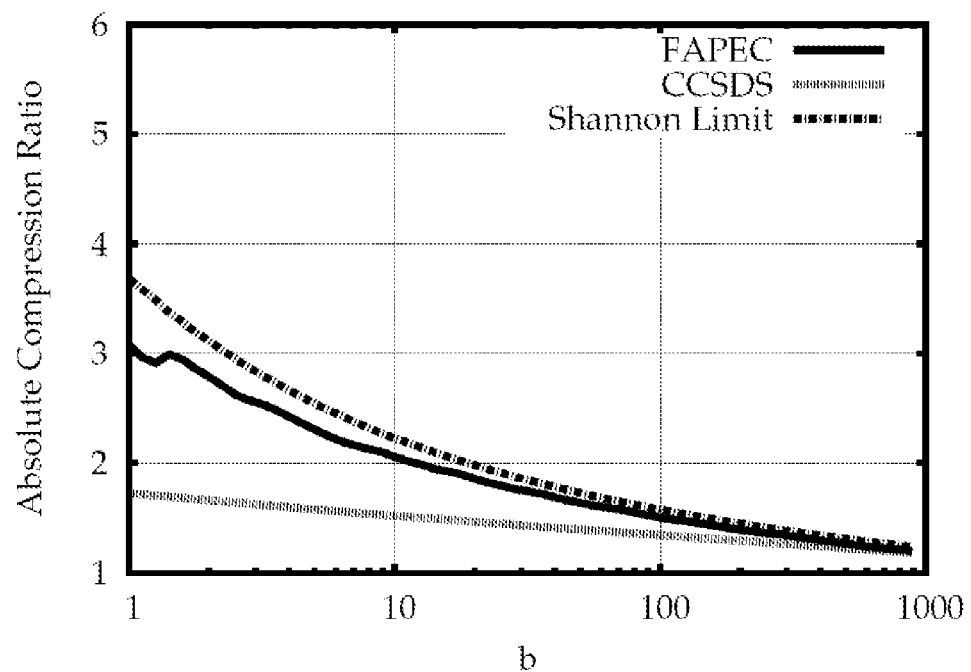
Figure 2F:
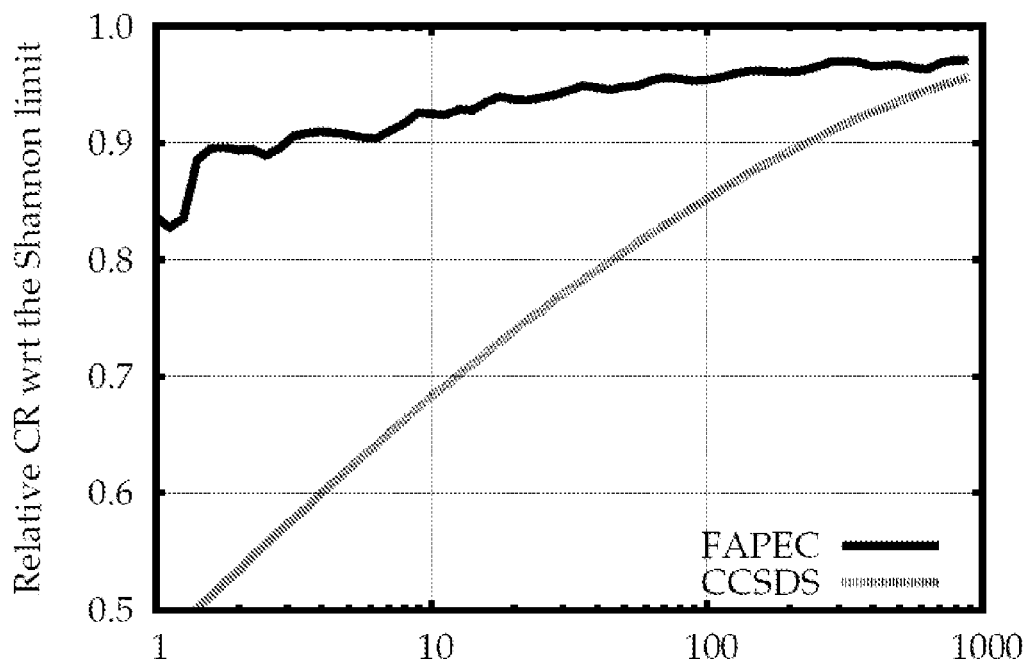
Figure 3A:
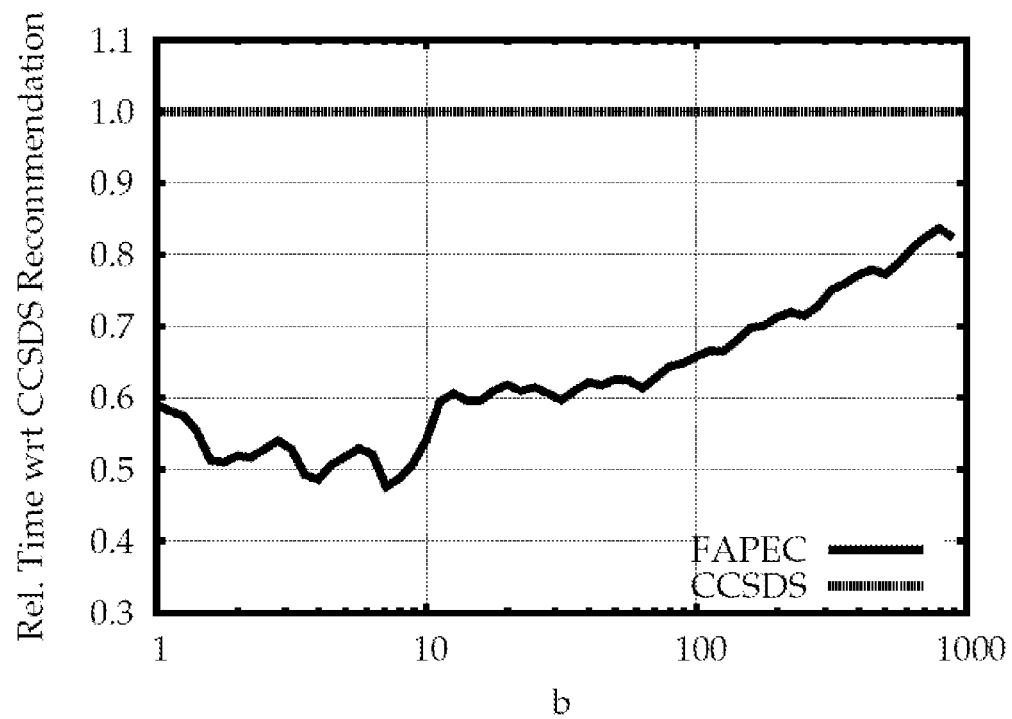
FIGS. 3a and 3b show the relative processing times of the coders for Laplacian distributions with 0.1% noise (3a) and 10% noise (3b), compared to the current CCSDS standard in highly optimized software implementations running in a Linux computer.
Figure 3B:
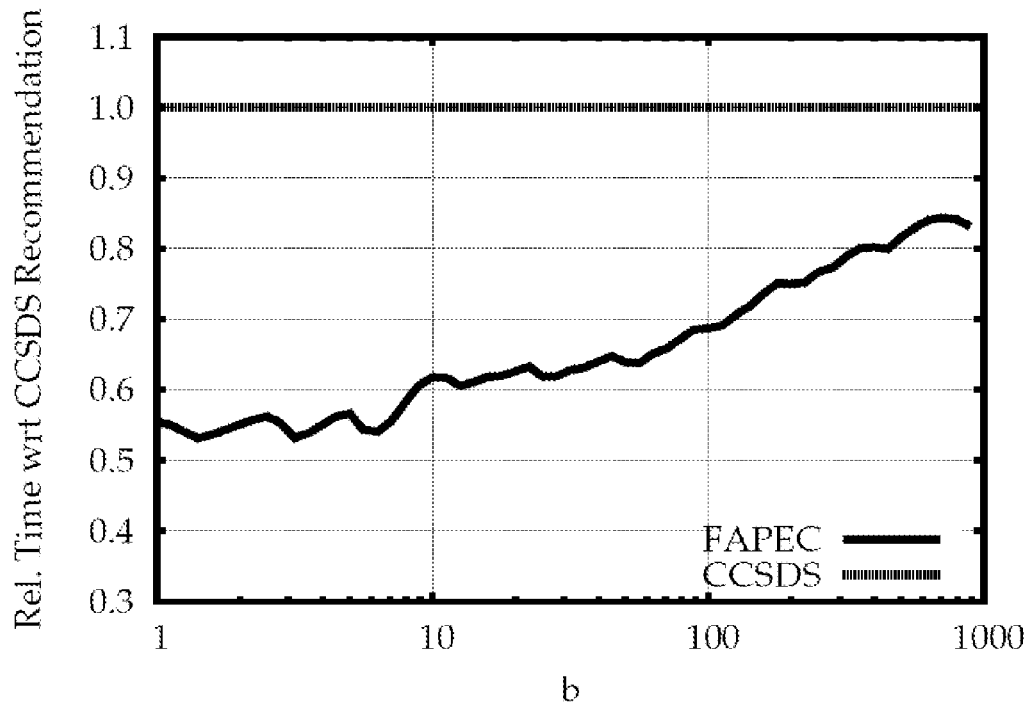
Figure 4A:
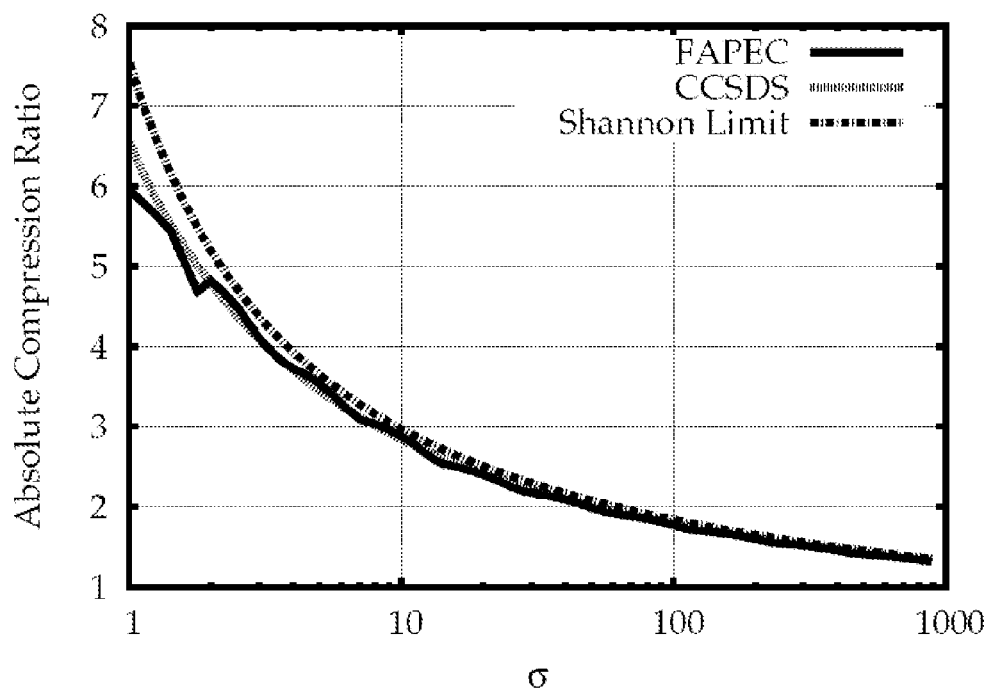
FIGS. 4a-4f show the compression ratios obtained for Gaussian distributions for tests with 0.1% (4a and 4b), 1% (4c and 4d) and 10% (4e and 4f) of additional flat noise.
Figure 4B:
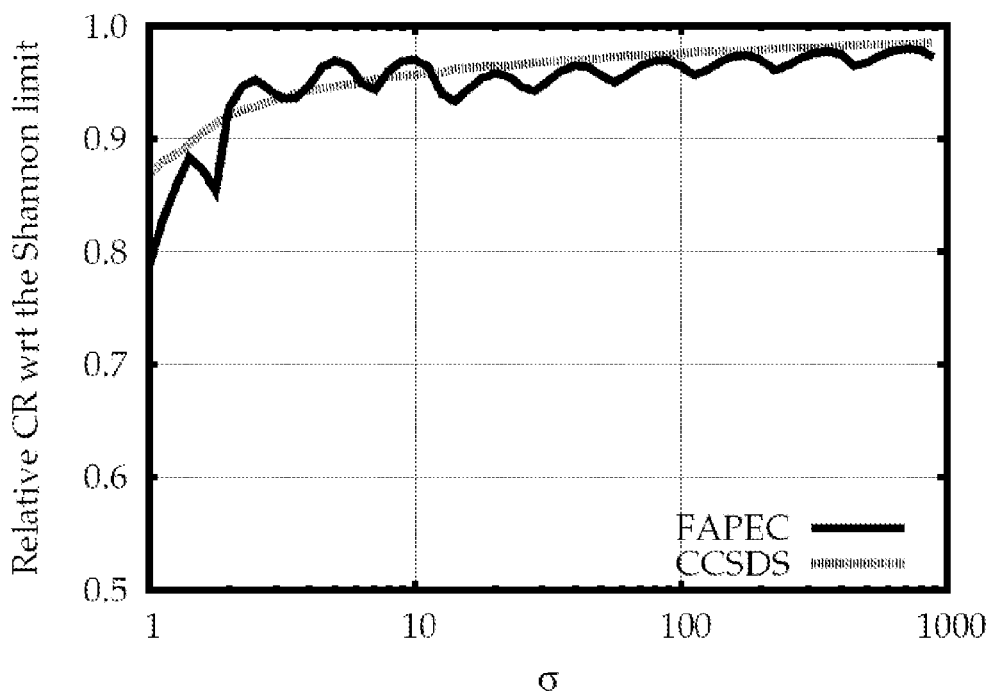
Figure 4C:
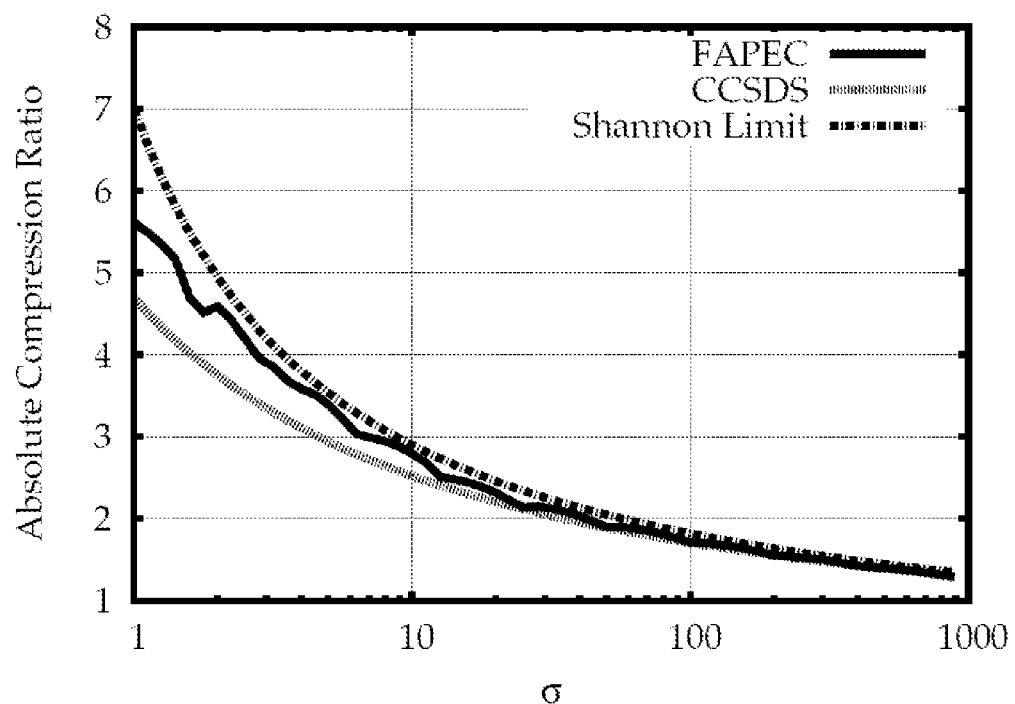
Figure 4D:
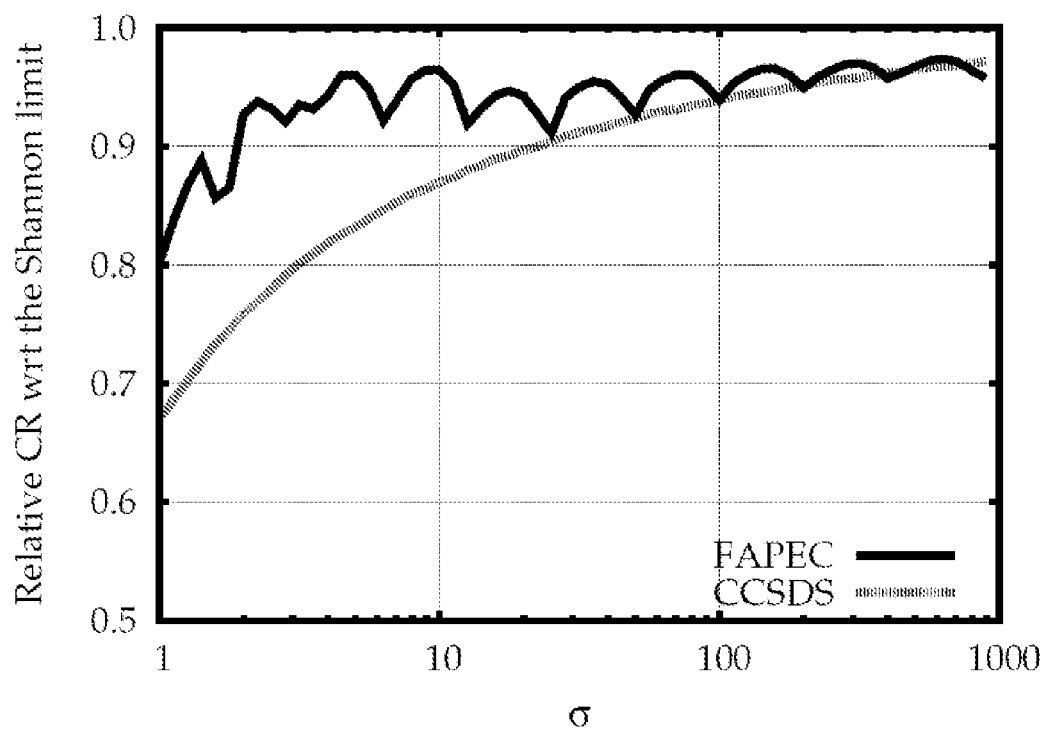
Figure 4E:
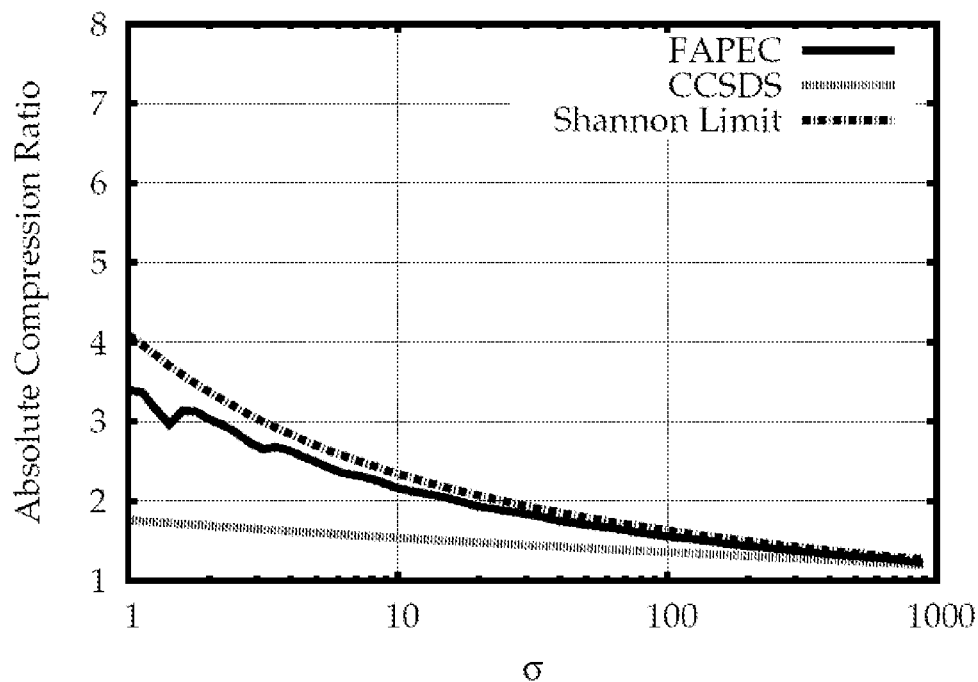
Figure 4F:
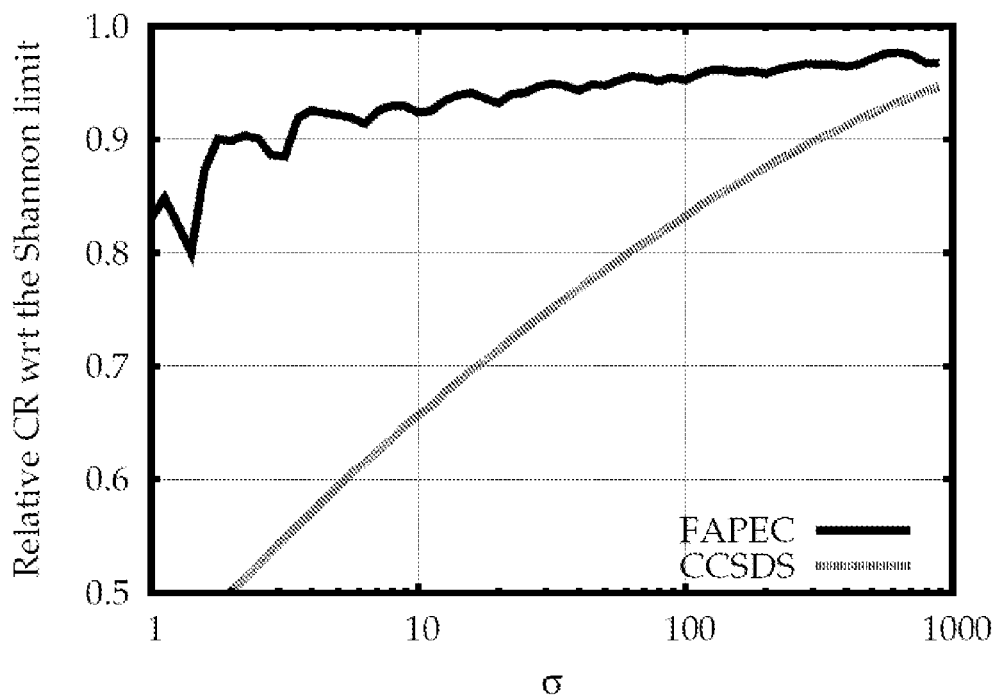

As it is shown in the attached figures, the FAPEC is an auto-calibrated coder that selects a coding table and coding option offering nearly-optimal results for a given data block. The length of a block is completely configurable and not necessarily restricted to a power of 2.

The method for fully adaptive calibration of a prediction error coder comprises (as illustrated in FIGS. 1a-1e):
  a first step of initialization (100), comprising
    a first initialization of a histogram of values (the histogram is a logarithmic-like histogram that is started with full resolution and increases its bin size for larger values), allocating the necessary resources, if it is not already available, and setting all bins to zero and mapping each histogram bin to a given value or range of values to be compressed; the histogram must have between 4 and H bins with $H=2^S$, being S the size in bits of the symbols to be compressed;
    a second initialization of a variable block size (B) to a given value; and
    an allocation of the necessary resources for using a prediction error coder;
  a second step of reception and accumulation of block-size data samples (200) wherein for each received value one more occurence is summed to the histogram bin associated to that value, storing the received value in a buffer and checking the amount of accumulated values has reached the block size value, thus comparing the "n" value (the amount of values in buffer) with the block size value (B);
  a third step of analysis of the histogram (300) and determination of the coding option comprising,
    checking if the histogram accumulates a given probability in a given amount of bins, with such bins corresponding to the lowest values, if so a low entropy (LE) coding option is selected;
    if the low double-smoothed entropy options are not fulfilled a new set of accumulated probability conditions are checked for a new given amount of bins wherein if said new conditions are fulfilled, a double-smoothed (DS) coding option is selected; and
    finally, if the low entropy options are not fulfilled neither, the large coding (LC) option is selected;
  a fourth step of analysis of the histogram and determination of a coding table, selecting the configuration for each of the prediction error coder coding segment that fulfills a given condition depending on the selected coding option of the third step (300), on the relation between the accumulated probability of each range of values and the required bits to code such range;

a fifth step of output a header (400) with the prediction error coder coding table determined; and wherein for each value stored in the buffer, said value is coded with a prediction error coder using the determined coding option and the determined coding table, outputting the resulting code; and wherein previous steps are repeated if more samples need to be compressed.

The performance of the different coders when compressing synthetic data is analyzed hereinafter as example. This analysis reveals their potential and gives a good hint of the results that can be achieved with real data. The Shannon limit of the simulations has also been included in the compression ratio figures, since it provides a reference of the efficiency of a compressor. The Shannon limit is the maximum theoretical limit of the compression ratio, calculated from the data entropy. The CPU time used by the coders, relative to the current CCSDS standard, is included as well. It is used as an indication of the processing requirements of the several coders. All the tests have been performed with optimized C++ implementations of the coders running on a standard x86 computer under GNU/Linux.

The coders have been subjected to an exhaustive test campaign in order to evaluate their performance under a large variety of scenarios with highly controlled conditions. During the different probes of the method it has been assessed that an adequate pre-processing stage leads to prediction errors roughly following a Laplacian distribution. Nevertheless, in some cases the distribution obtained after the pre-processing stage was closer to a Gaussian. Consequently, the performance of the coders with such distribution may be studied as well. It has been implemented a software tool that produces random data following a Laplacian or a Gaussian distribution by means of a Montecarlo method. Additionally, this tool can also generate random data following uniform and "inverse Laplacian" distributions, namely, with increasing probability for larger values. They are used as "worst cases". Namely, to check how the coders perform under such extreme situations. At the end, the first two cases make possible to estimate the performance of the coders when applied to real data with known statistics, while the latter indicates the worst results that can be expected from them.

It is clear that real data will usually be contaminated with noise, distortion and other undesired effects, so the coders must also be tested in the presence of noise in order to have more representative results. From the Laplacian, Gaussian and inverse-Laplacian reference distributions, different sets of test data with different noise levels have been prepared. As a first approach, the noise that has been introduced comes from a uniform distribution in the whole data range. More realistic studies can be done using noise distributions approaching the typical responses of different instrumentation systems. The amount of uniform noise is variable, representing a percentage of 0.1%, 1% and 10% of the total data. These values cannot be indicated as signal-to-noise ratios (SNR) of the data. Instead, they refer to the fraction of the data representing "outliers", distortion and noise. The case of 0.1% of noise is an almost ideal situation, while 10% of noise is a quite bad situation, although some instrumentation can lead to similar or even worse noise levels. Summarizing, there are a set of test cases that should cover the most typical operating conditions. FIGS. 2 to 5 show the results of the compression tests, including the ranges of the distributions that are typically applicable to real cases. They cover from very bad situations to very good ones. The abscissa of the plots corresponds to the parameters of the distributions, namely, b for Laplacian and σ for Gaussian. A small parameter value means a low dispersion of the data (and hence a good prediction in the pre-processing stage), and vice versa.

The simulation process is composed of 51200 randomly generated 16-bit samples. The symbol length limits the maximum compression ratio that can be achieved with direct entropy coding of each value. Nevertheless, it must be noted that the CCSDS recommendation introduces some shortcuts for extremely good statistics that can lead to higher ratios. Each result for a given coder and a given parameter is extracted from 60 different simulation processes, each of them with independent data generation. From them, it has been averaged the obtained compression ratio. It is necessary due to the stochastic nature of the simulation data.

The PEM stage of the CCSDS coder must be taken into account as well, so it has also been implemented and included in the tests. The introduction of this stage leads to some restrictions in the sequence of random data. In order to fulfill the objectives, it has been feed the PEM with synthetic "measurement" data, i.e. prior to the pre-processing stage, looking for the same resulting distribution after pre-processing. During this process, some values of the uniform noise portion (i.e. the outliers) had to be discarded due to the PEM restrictions, and hence the compression results may not be completely accurate. Such discarded noise samples are typically 20% of the total added noise, so the effect is relatively small. Nevertheless, it is worth mentioning that it will lead to datasets with slightly lower noise fractions for the CCSDS tests than for the rest of coders.

Regarding the processing times, it has been calculated averaging the five best times from the 60 executions. It is mandatory in order to remove undesired effects due to external processes, such as computer interrupts or other processes also running in the same computer. This is a suitable method to offer CPU consumptions with a high confidence. The time measurement only takes into account the coding part in FAPEC, while in the CCSDS tests it also includes the mapping process (PEM). This is done because it is not needed in PEC and FAPEC. It will increase the processing load, but its inclusion is necessary in order to obtain comparable results.

FIG. 2 illustrates the compression ratios achieved by the coders when applied to data following Laplacian distributions with different dispersion and noise levels. The top panels (2a, 2c and 2e) correspond to the absolute compression ratios achieved, which will depend on the data dispersion and the noise levels. The most interesting results are shown in the bottom panels (2b, 2d and 2f), with the relative compression ratios with respect to the Shannon limit. Such theoretical limit cannot be surpassed by an entropy coder, so it can be understood as an indication of the efficiency of the coding algorithm.

The CCSDS standard offers an excellent efficiency under ideal conditions or even with a small level of 0.1% of uniform noise. The efficiency is larger than 90% in all the typical range of Laplacian dispersions, covering compression ratios from 1.3 to more than 5. FAPEC is not far from CCSDS. Namely, the efficiency only decreases a modest 5% in the worst of the cases. At these compression levels (with noiseless data) this decrease is difficult to appreciate in the absolute compression ratio. When the outliers are increased to an otherwise realistic portion of 1% the results make evident that the CCSDS recommendation is especially intended for noiseless data. This coder is not able to take full advantage of the noisy data statistics, decreasing its efficiency below 75% at small dispersions, i.e. at low entropies. Its efficiency is still good for high entropies, but in general this coder offers the worst results. On the other hand, the present invention (FAPEC) offers almost the same efficiency as in the case of 0.1% noise, that is, typically above 90%. This is a good demonstration of the ability of FAPEC to adapt to outliers and noise in the data.

FIGS. 2c to 2f are a stunning demonstration of the robustness of the coder of the present invention and, at the same time, of the high dependency on noise of the CCSDS standard. When 10% of the data is uniform noise, the CCSDS efficiency drastically decreases even below 50%, being unable to reach a compression ratio of 2 even with low entropies. On the other hand, the present invention (FAPEC) still offers efficiencies larger than 80% in the worst of the cases, offering compression ratios up to 3.

In sight of these results it is clear that FAPEC is excellent solutions for the compression of noisy data. The FAPEC solution becomes the best choice when the data processing times are taken into account, illustrated in FIG. 3. In this figure it can be clearly seen that FAPEC is much quicker than the current CCSDS standard. More specifically, FAPEC requires less than 85% of the processing time of CCSDS in the worst of the cases, while under typical conditions it only requires 50% to 70%. In these plots it can also be appreciated an even quicker operation of FAPEC when dealing with low entropy data. It is caused by the histogram analysis, which stops as soon as the expected accumulated probabilities are reached.

FIG. 4 shows the compression ratios obtained for different datasets following Gaussian distributions. As can be seen in the top right panel, even with just 0.1% of noise the CCSDS solution is not the best choice anymore. Although its efficiency is fairly constant and well above 90% for the most typical entropy levels, the results obtained with FAPEC are better in some cases and, in general, they are extremely close to those obtained with the current compression standard.

When adding a noise level of just 1% to the Gaussian data, the efficiency of the CCSDS method drastically decreases below the levels offered by its competitor. Efficiencies larger than 90% are only achieved for high entropies, where the compression ratio achievable is small anyway. The FAPEC coder offers efficiencies larger than 90% for almost any entropy level. The last scenario studied corresponds to a Gaussian distribution with 10% of uniform noise. The results shown in FIGS. 4e and 4f confirm the extreme robustness of FAPEC in front of data outside the expected statistics. The absolute ratios obtained with FAPEC are larger than 3 for the lowest entropies tested, while the CCSDS standard cannot reach a ratio of 2.

Summarizing, FAPEC offer an almost constant coding efficiency under any condition, and offer almost the largest compression ratios achievable by an entropy coder without any previous calibration. Regarding the processing requirements, the results obtained with the Gaussian data are very similar to those obtained with Laplacian data shown in FIG. 3.

The last set of tests applied to the coders corresponds to the worst situations, that is, with the inverse-Laplacian and uniform (or flat) distributions. These results are very important, in order to know which ratios are the worst that can be expected from a data compressor in case of, for example, an instrument failure. Two extreme cases that are been analyzed for these coders are, firstly, a random sequence of values covering the full dynamic range, thus representing flat noise. Secondly, an inverse-Laplacian data distribution can be interpreted as the result of completely wrong data predictions and, hence, extremely large prediction errors. The results in the case of the inverse-Laplacian distribution only depend on the uniform noise added (regardless of the value of b), due to the fact that all the useful samples are close to the highest values.

It means that, in the case of PEC and FAPEC, they will always be coded with the highest segment. Two noise levels have been chosen as representative tests, namely, 1% and 10%. The accompanying table summarizes the inverse-Laplacian results with these noise levels, together with the flat distribution results. The results of the CCSDS standard are not included here. The reason is that in these extreme cases the bias in the data generation (due to the PEM restrictions previously described) is not negligible. Thus, the results will not reflect the actual performance. In any case, the CCSDS recommendation introduces some mechanisms that can detect extremely bad statistics and, from that, a "no compression" choice will be selected. Therefore, the expected compression ratios for the CCSDS standard should be very close to 1.

TABLE

| Coder | Compression Ratio | | | Time | | |
|---|---|---|---|---|---|---|
| | 1% | 10% | Flat | 1% | 10% | Flat |
| FAPEC | 0.87 | 0.85 | 0.90 | 1.00 | 1.00 | 1.00 |
| PEC | 0.80 | 0.80 | 0.84 | 0.84 | 0.81 | 0.73 |

The table shows the compression ratios and relative processing times for the worst-case tests. The results shown in the table reveal that all of the coders expand the data when dealing with such extreme statistics. As it is expected, the worst results correspond to PEC, since its fixed calibration is unable to deal adequately with the high data entropy. Despite of this, the data is expanded only a ratio of 1.25 (that is, a compression ratio of 0.8). FAPEC, on the other hand, performs slightly better. Regarding the compression times, they cannot be referred to the CCSDS standard for the reasons above mentioned, so FAPEC has been used as the reference case. It can be appreciated here a slow-down of the FAPEC operation. The reason is that the complete histogram must probably be analyzed in these extreme cases, which leads to a higher processing overhead with respect to PEC.

Finally, it is worth mentioning that the PEC coder has a good behaviour if the adequate histogram is used for each of the scenarios (deviation and noise levels) that is, with a very good knowledge of the data statistics. So PEC is specially useful for applications where a good and reliable knowledge of the data is available a priori. But his efficiency is much worse in scenarios when the input data statistical distribution is not well known. The present invention (FAPEC) solves this problem.

Figure 5:
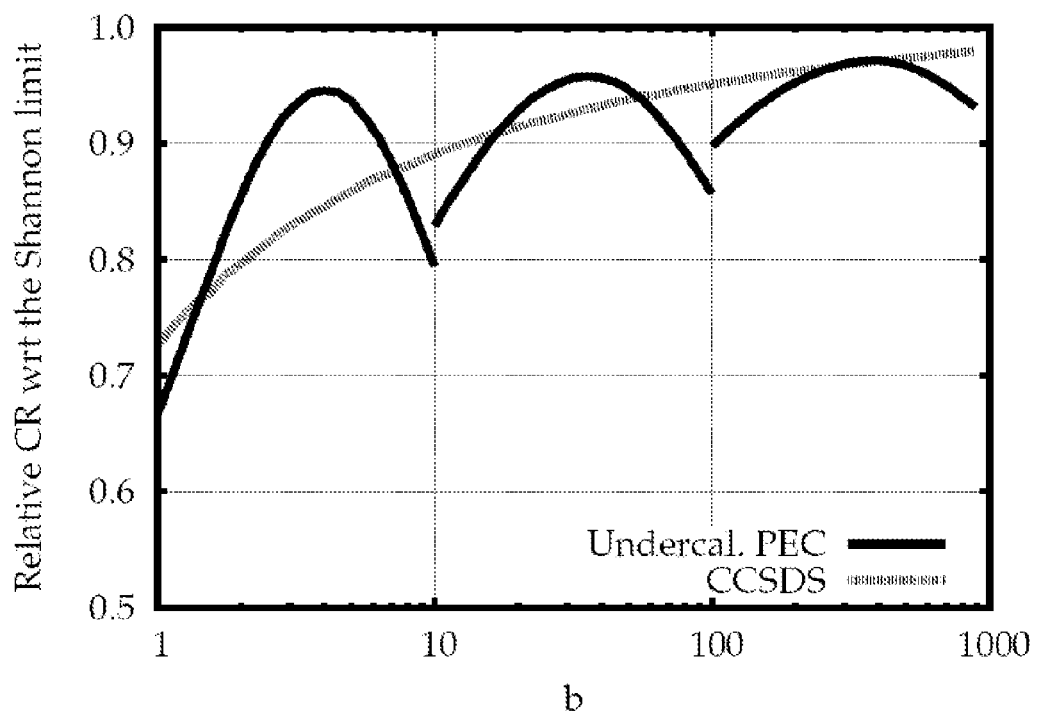
FIG. 5 shows the relative efficiency of an under-calibrated PEC, compared to the Shannon limit and to the CCSDS standard.

For illustrating the limitations of PEC, this partially adaptive coder has been tested using suboptimal calibrations. PEC has been calibrated just for three different statistics, namely, $b=0.29$ (low entropy), $b=0.029$ (medium entropy) and $b=0.0029$ (high entropy), and it has been applied it to all the synthetic datasets previously shown. The main result is that a fixed PEC calibration compresses typically above 80% of the Shannon limit in a range of one decade around a given calibration (half a decade up or down). The composition shown in FIG. 5 illustrates these results for the Laplacian case with 1% noise level. In this figure, it can be seen that PEC performance is very dependent on the data distribution and that his efficiency decreases a lot for small changes in the data statistic distribution. If applied to data following a Gaussian statistic the margin is slightly narrower than this.

On the other hand, FAPEC as an adaptive algorithm achieves very high compression ratios without the need of any prior calibration. Also, FAPEC is able to adapt to changes in the data down to the block length level, even for blocks that significantly move away from the global statistics. It allows a better performance of this coder in cases of variable statistics, such as those coming from several instrument outputs combined into a single data stream, or in case of disturbances in the measurements.

The above-explained examples have been carried out with an exhaustive campaign of tests using synthetic data with the most typical probability distributions that is possible to find in prediction errors, this is, Laplacian and Gaussian with different noise levels. The results obtained reveal an excellent robustness FAPEC, object of the present invention in front of noise and unexpected data. The current CCSDS standard for lossless data compression is able to outperform FAPEC only under the most favorable conditions, that is, with almost noiseless Laplacian distributions. In the rest of scenarios, the CCSDS algorithm is not able to deal with the noise, outliers or unexpected data distributions. When 10% of the data is uniform noise, the CCSDS efficiency decreases below 50% of the Shannon limit, while PEC keeps offering more than 90%. The FAPEC offers the same efficiency than PEC but without the need of any preliminary training process. Furthermore, FAPEC has the possibility of being fine-tuned for a given data distribution, which is a clear advantage in front of the CCSDS recommendation, which is only prepared for Laplacian distributions. Despite of being currently tuned for Laplacian distributions as well, FAPEC has revealed an excellent performance on Gaussian distributions and, of course, in datasets with high noise levels. Furthermore the CCSDS standard requires almost twice the processing requirements than FAPEC.

Summarizing, it has been developed a fully-adaptive entropy coder (FAPEC) that is probably the best solution for space-based communications, owing to its robustness in compression and its low processing requirements. The compression ratios obtained with this coder are so close to the Shannon limit that they can only be significantly improved by moving to dictionary coding. This coder is therefore an excellent alternatives to the current CCSDS standard for lossless data compression.

The invention claimed is:

1. A method for adaptive calibration of a prediction error coder on a computing processor, the method comprising:
    a first step of initialization, comprising:
        a first initialization of a histogram of values for counting occurrences of individual low values and of groups of large values, allocating storage or memory resources for the first initialization, wherein if the storage or memory resources for the first initialization are not already available, setting all histogram bins to zero occurrences and mapping each bin of the histogram to a given value for low values, or range of values for high values, to be compressed;
        a second initialization of a variable block size to a given value; and
        an allocation of computing and memory resources for using the prediction error coder;
    a second step of reception and accumulation of block-size values, wherein for each received value, one more occurrence is summed to the histogram bin associated to that value, storing the received value in a buffer and checking whether the number of accumulated values has reached the block size value;
    a third step of analysis of the histogram and determination of the coding option comprising:
        checking if the histogram accumulates a sufficient number of occurrences in the first bins corresponding to the lowest values, if so, a low entropy coding option is selected for the prediction error coder;
        if the low entropy conditions are not fulfilled, new thresholds of accumulated number of occurrences are checked for the first, wherein if said new low entropy conditions are fulfilled, a double-smoothed coding option is selected for the prediction error coder; and
        finally, if the double-smoothed entropy conditions are not fulfilled, the large coding option is selected for the prediction error coder;
    a fourth step of analysis of the histogram and determination of a coding table, selecting the number of bits to be used for each of the prediction error coder coding segments that fulfill a given condition depending on the selected coding option of the third step, for the relation between the accumulated occurrences of each range of values and the required bits to code the range of values;
    a fifth step of output to a header with the prediction error coder coding option determined in the third step and the coding table determined in the fourth step, wherein, for each value stored in the buffer, said value stored in the buffer is coded with the prediction error coder allocated in the first step using the determined coding option and the determined coding table, outputting the resulting code; and
    wherein previous steps are repeated if more values need to be compressed.

2. The method according to claim 1, wherein the histogram must have between 4 and H bins with $H=2^S$, S representing a maximum length in bits of the values to be compressed.

3. The method according to claim 1, wherein the histogram-to-values mapping follows a logarithmic-like rule that is started with full resolution wherein one bin is mapped to one value, for at least the values between zero and eight and increases bin mapping size for larger values wherein a bin is associated to a plurality of values indicated by a power-of-two number configurable by the user, using less than 60 bins to count occurrences of values between zero and one million.

4. An adaptive prediction error coder device comprising:
    means for initializing comprising:
        first means configured for initializing a histogram of values to be used for counting occurrences of individual low values and of groups of large values, allocating memory or storage resources for the first means, wherein if the memory or storage resources for the first means are not already available, setting all histogram bins to zero occurrences, and mapping each bin of the histogram to a given value for the low values, or range of values for high values, to be compressed;
        second means configured for initializing a variable block size to a given value; and
        third means configured for allocating computing and memory resources for using the prediction error coder;
    means configured for receiving and accumulating block-size values, wherein, for each received value, one more occurrence is summed to the histogram bin associated to the received value, storing the received value in a buffer and checking whether the number of accumulated values has reached the block size value;
    means configured for analyzing the histogram and determining the coding option for the prediction error coder selected from:
        low entropy coding option;
        double-smoothed coding option, and
        large coding option;
    means configured for analyzing the histogram and determining a coding table, selecting the number of bits to be used for each prediction error coder coding segment that fulfills a given condition depending on the selected coding option, for the relation between the accumulated probability of each range of values and the required bits to code the range of values; and means for creating a bitstream header with the prediction error coder coding option and coding table determined, wherein, for each value stored in the buffer, said value stored in the buffer is coded with the prediction error coder using the determined coding option and the determined coding table and, outputting the resulting code.

5. The device according to claim 4, wherein the histogram has between 4 and H bins with $H=2^S$, representing a maximum length in bits of the values to be compressed.

6. The device according to claim 4, wherein the histogram is a logarithmic-like histogram that is started with full resolution, for at least the values between zero and eight, and increases bin mapping size for larger values, wherein a bin is associated to a plurality of values indicated by a power-of-two number configurable by the user, using less than 60 bins to count occurrences of values between zero and one million.

7. A non-transitory computer readable device having a computer program stored thereon comprising a set of instructions for performing the method as defined in claim 1.

* * * * *